(12) United States Patent
Venezia et al.

(10) Patent No.: US 8,947,572 B2
(45) Date of Patent: Feb. 3, 2015

(54) DUAL-SIDED IMAGE SENSOR

(75) Inventors: Vincent Venezia, Sunnyvale, CA (US); Duli Mao, Sunnyvale, CA (US); Hsin-Chih Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/254,421

(22) PCT Filed: May 24, 2010

(86) PCT No.: PCT/US2010/035990
§ 371 (c)(1),
(2), (4) Date: Sep. 1, 2011

(87) PCT Pub. No.: WO2011/149451
PCT Pub. Date: Dec. 1, 2011

(65) Prior Publication Data
US 2013/0063641 A1    Mar. 14, 2013

(51) Int. Cl.
*H04N 3/14* (2006.01)
*H01L 27/146* (2006.01)

(52) U.S. Cl.
CPC ................ *H01L 27/14627* (2013.01)
USPC .......................................... 348/308

(58) Field of Classification Search
USPC ....................................... 348/308
See application file for complete search history.

(56) References Cited

U.S. PATENT DOCUMENTS

| 5,134,274 | A | | 7/1992 | Poole et al. |
| 6,150,708 | A | * | 11/2000 | Gardner et al. ............... 257/618 |
| 7,539,412 | B2 | | 5/2009 | Lee et al. |
| 2002/0030768 | A1 | | 3/2002 | Wu |
| 2007/0269205 | A1 | * | 11/2007 | Lee et al. ...................... 396/542 |
| 2008/0099804 | A1 | | 5/2008 | Venezia et al. |
| 2009/0140364 | A1 | * | 6/2009 | Ishihara ........................ 257/434 |
| 2009/0200589 | A1 | | 8/2009 | Qian et al. |
| 2009/0200631 | A1 | | 8/2009 | Tai et al. |

FOREIGN PATENT DOCUMENTS

| CN | 1889270 A | 1/2007 |
| EP | 1367650 A1 | 12/2003 |

OTHER PUBLICATIONS

PCT/US2010/035990, PCT International Preliminary Report on Patentability mailed Dec. 6, 2012, 10 pages.
TW 099121108; Office Action and Search Report with English translation, issued Mar. 19, 2013, 10 pages.
PCT/US2010/035990, International Search Report and Written Opinion of the International Searching Authority mailed Feb. 21, 2011, 15 pages.
CN 201080065219.X; Office Action and Search Report, issued Aug. 13, 2014, 6 pages.

* cited by examiner

*Primary Examiner* — James Hannett
(74) *Attorney, Agent, or Firm* — Blakely Sokoloff Taylor & Zafman LLP (57) ABSTRACT

An apparatus for a dual-sided image sensor is described. The dual-sided image sensor captures frontside image data incident upon a frontside of the dual-sided image sensor within an array of photosensitive regions integrated into a semiconductor layer of the dual-sided image sensor. Backside image data incident upon a backside of the dual-sided image sensor is also captured within the same array of photosensitive regions.

18 Claims, 7 Drawing Sheets

DUAL-SIDED IMAGE SENSOR

TECHNICAL FIELD

This disclosure relates generally to imaging devices, and in particular but not exclusively, relates to CMOS image sensors.

BACKGROUND INFORMATION

Image sensors have become ubiquitous. They are widely used in digital still camera, cellular phones, security cameras, as well as, medical, automobile, and other applications. The technology used to manufacture image sensors, and in particular, complementary metal-oxide semiconductor ("CMOS") image sensors ("CIS"), has continued to advance at great pace. For example, the demands of higher resolution and lower power consumption have encouraged the further miniaturization and integration of these image sensors.

As pixel cells decrease, so does the size of the photodiodes included within them. Smaller photodiodes results in the reduction of the dynamic range of the CIS and a degradation of image quality. One approach to enhance the performance of small photodiodes is to increase the impurity concentration of the sensor region of a photodiode. However, increasing the impurity concentration of the sensing region of a photodiode tends to cause undesirable effects, such as an increase in image lag.

The dynamic range of a CIS is the ratio of maximum and minimum light intensities that an image sensor can capture. The full well capacity of each photodiode in an image sensor limits the image sensor's ability to capture bright and dark subjects at the same time. As a result, if a long exposure is used to capture dark subjects, bright subjects can lose contrast and become a bright spot. If a short exposure is used to capture bright subjects, dark subjects could blend into a dark background and simply disappear.

Conventional techniques of obtaining one overlaid image from two images captured independently and combining or referencing one onto another include using beam combiners and other optical devices to combine two optical images into one optical path of incident light, which is exposed to a single image sensor. Other methods of obtaining one overlaid image includes using a camera module with a double-sided image sensor chip fabricated by adhering two front-side illuminated ("FSI") image sensor chips together so that the pixel arrays are facing opposite directions. In this way, two images originating from independent sources can be imagined simultaneously, the images could be processed to obtain one overlaid image.

The former conventional technique introduces optical errors from the beam combiners and other optical devices. The latter conventional technique using back-to-back bonded FSI image sensor chips is bulky, which increases manufacturing costs. With the latter technique, the two images must be precisely aligned through signal processing, often done independently after acquiring each image, and the use of two FSI image sensor chips to obtain one image doubles power consumption and manufacturing costs of the camera module.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus, method of operation, and method of fabrication of a dual-sided image sensor are described herein. In the following description numerous specific details are set forth to provide a thorough understanding of the embodiments. One skilled in the relevant art will recognize, however, that the techniques described herein can be practiced without one or more of the specific details, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
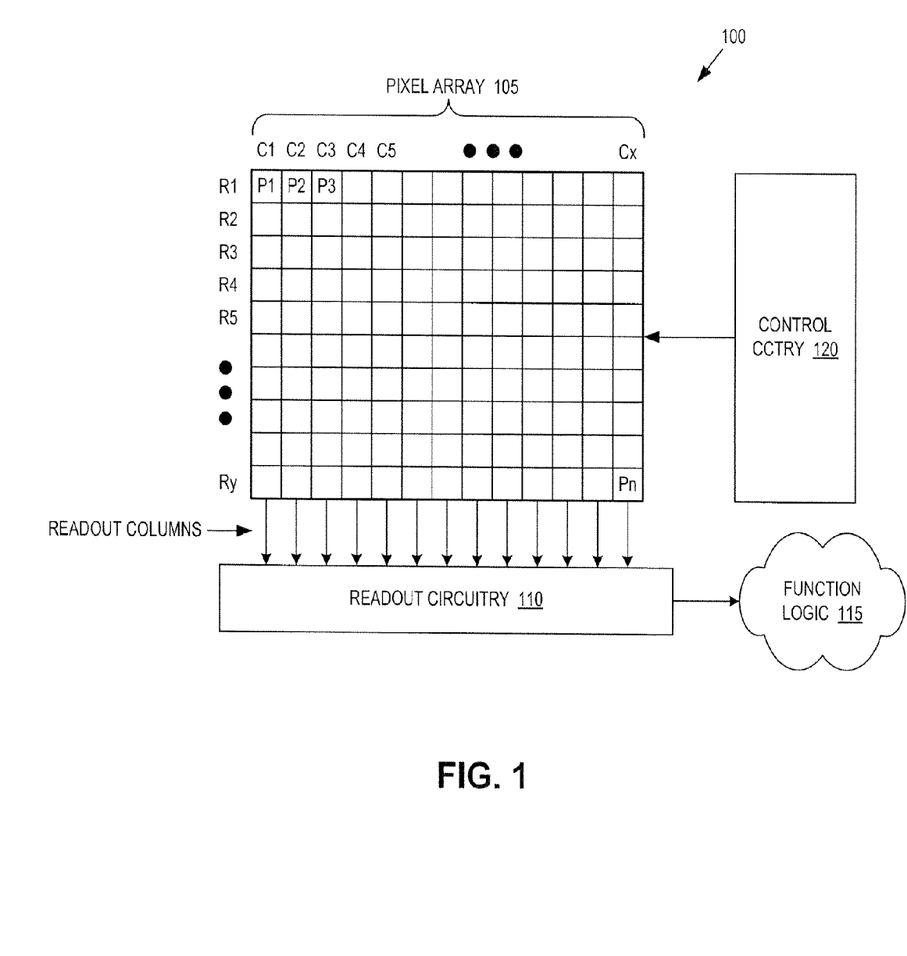
FIG. 1 is a functional block diagram illustrating a dual-sided image sensor, in accordance with an embodiment of the invention.

FIG. 1 is a functional block diagram illustrating a dual-sided image sensor 100, in accordance with an embodiment. The illustrated embodiment of dual-sided image sensor 100 includes a pixel array 105, readout circuitry 110, function logic 115, and control circuitry 120.

Pixel array 105 is a two-dimensional ("2D") array of dual-sided, illuminated image sensors or pixels (e.g., pixels P1, P2 . . . , Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 110 and transferred to function logic 115. Readout circuitry 110 may include amplification circuitry, analog-to-digital ("ADC") conversion circuitry, or otherwise. Function logic 115 may simply store the image data or even manipulate the image data by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Control circuitry 120 is coupled to pixel array 105 to control operational characteristic of pixel array 105 (e.g., exposure window, exposure timing, image gain, etc.). For example, control circuitry 120 may generate a shutter signal for controlling image acquisition. In one embodiment, the shutter signal is a global shutter signal for simultaneously enabling all pixels within pixel array 105 to simultaneously capture their respective image data during a single acquisition window. In an alternative embodiment, the shutter signal is a rolling shutter signal whereby each row, column, or group of pixels is sequentially enabled during consecutive acquisition windows.

Figure 2:
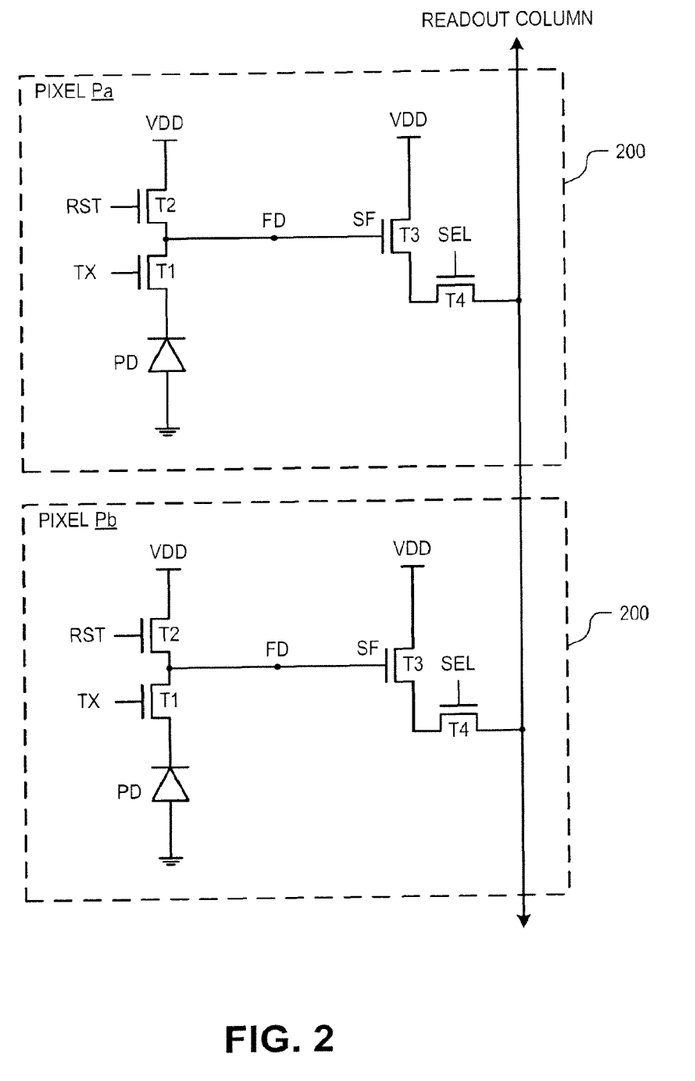
FIG. 2 is a circuit diagram illustrating pixel circuitry of two 4T pixels within a dual-sided image sensor, in accordance with an embodiment of the invention.

FIG. 2 is a circuit diagram illustrating pixel circuitry 200 of two four-transistor ("4T") pixels within pixel array 105, in accordance with an embodiment of the invention. Pixel circuitry 200 is one possible pixel circuitry architecture for implementing each pixel within pixel array 105 of FIG. 1. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures. In FIG. 2, pixels Pa and Pb are arranged in two rows and one column. The illustrated embodiment of each pixel circuitry 200 includes a photodiode PD, a transfer transistor T1, a reset transistor T2, a source-follower ("SF") transistor T3 and a select transistor T4. During operation, transfer transistor T1 receives a transfer signal TX, which transfers the charge accumulated in photodiode PD to a floating diffusion node FD. In one embodiment, floating diffusion node FD may be coupled to a storage capacitor (not shown) for temporarily storing image charges. Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 200 to the readout column line under control of a select signal SEL. In one embodiment, the TX signal, the RST signal, and the SEL signal are generated by control circuitry 120.

Figure 3:
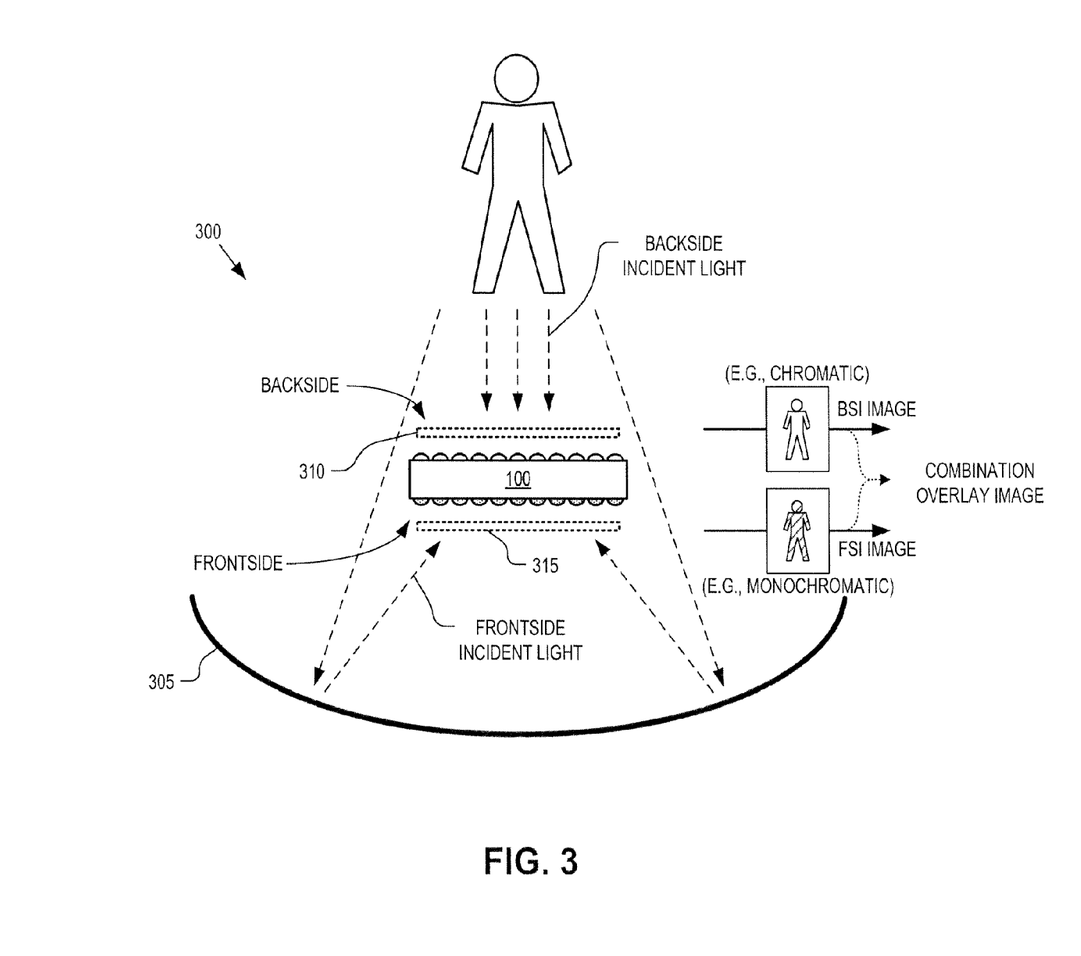
FIG. 3 is a block diagram illustrating an optical arrangement for a dual-sided imaging system, in accordance with an embodiment of the invention.

FIG. 3 is a block diagram illustrating an optical arrangement for a dual-sided imaging system 300, in accordance with an embodiment of the invention. The illustrated embodiment of dual-sided imaging system 300 includes dual-sided image sensor 100, a reflector 305, a backside shutter 310, and a frontside shutter 315.

Reflector 305 along with backside shutter 310 and frontside shutter 315 enable either backside illuminated ("BSI") image data or frontside illuminated ("FSI") image data to be selectively captured using a single pixel array 105 of dual-sided image sensor 100. For example, BSI image data may be captured by opening backside shutter 310 to permit backside incident light to reach the backside of dual-sided image sensor 100, while closing frontside shutter 315 to block frontside incident light from reaching the frontside of dual-sided image sensor 100. Alternatively, FSI image data may be captured by opening frontside shutter 315 to permit frontside incident light to reach the frontside of dual-sided image sensor 100, while closing backside shutter 310 to block backside incident light from reaching the backside of dual-sided image sensor 100. Furthermore, if a combination overlay image is desired, then both backside shutter 310 and frontside shutter 315 may be opened during either overlapping or sequential exposure windows so that pixel array 105 can capture image data from both sides. In a sequential configuration, the image data captured by pixel array 105 from one side may simply be added to the image data previously captured from the other side. Alternatively, in a sequential configuration, the FSI image data and the BSI image data can be separately readout and combined as a post image processing operation using function logic 115. Of course, it should be appreciated that in embodiments where reduced selectively over the combinations of FSI, BSI, and combination overlay images is acceptable or even desirable, then the present invention may be implemented without one or both shutters 310 and 315.

In one embodiment, reflector 305 is a parabolic mirror positioned on one side of dual-sided image sensor 100 (e.g., illustrated as positioned facing the frontside) and capable of focusing light originating from the other side of dual-sided image sensor 100, as illustrated in FIG. 3. In other embodiments, reflector 305 may be replaced with various optical assemblies including a series of mirrors, beam splitters, and the like. In alternative embodiments, reflector 305 may be entirely eliminated to facilitate an imaging device capable of capturing different images from two different sides with a single dual-sided image sensor 100 (e.g, positioning dual-sided image sensor 100 with in a cell phone with the backside positioned for capturing images from a backside of the cell phone while the frontside faces the operator for capturing self-portraits or facilitating video calls).

Each side of dual-sided image sensor 100 may or may not be covered with a filter array. For example, the backside may be covered by a chromatic filter array (e.g., Bayer pattern filter array), while the frontside may be covered by a monochromatic filter array for capturing monochromatic image data (e.g., grayscale, black & white, etc.). One or both sides may include an infrared filter array. Alternatively, one or both sides may include no filter array.

Shutters 310 and 315 may be implemented as mechanical shutters or electro-optical shutters. For example, shutters 310 and 315 may be liquid crystal display ("LCD") shutters. In one embodiment, frontside shutter 315 may be integrated into or onto reflector 305 and the reflective properties of reflector 305 itself directly manipulated by the application of electrostatic fields. Of course, if only combination overlay images are desired, then both shutters 310 and 315 as well as reflector 305 may be eliminated.

Dual-sided imaging system 300 can facilitate a number of functions. For example, different optical filters can be applied to either side to improve low light response, to achieve various types of image overlays, or even to improve the dynamic range of the imaging device. In one embodiment, the FSI image data may be captured and used to either apply post image processing to the BSI image, or even captured first and then analyzed to configure pixel array 105 and/or readout circuitry 110 prior to capturing the BSI image data.

Figure 4:
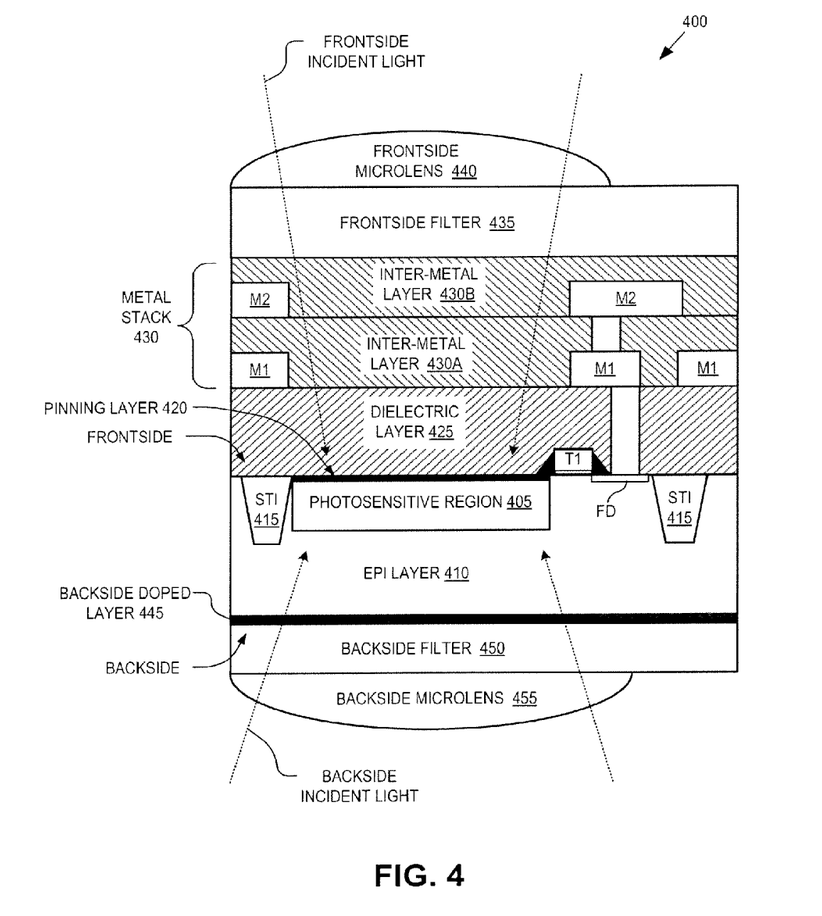
FIG. 4 is a cross sectional view dual-sided pixel cell, in accordance with an embodiment of the invention.

FIG. 4 is a cross sectional view of a dual-sided pixel cell 400, in accordance with an embodiment of the invention. Dual-sided pixel cell 400 represents one possible implementation of pixels P1, P2 Pn within pixel array 105. Dual-sided pixel cell 400 is a BSI/FSI combination device, having optical paths through both sides of the device that permit both frontside incident light and backside incident light to reach the photosensitive region.

The illustrated embodiment of dual-sided pixel cell 400 includes a photosensitive region 405 disposed within an epitaxial layer 410, shallow trench isolations 415, pixel circuitry (only a portion is illustrated including photosensitive region 405, transfer transistor T1, and floating diffusion FD), a pinning layer 420, a dielectric layer 425, a metal stack 430, a frontside filter 435, a frontside microlens 440, a backside doped layer 445, a backside filter 450, and a backside microlens 455. The illustrated embodiment of metal stack 430 includes metal layers M1 and M2 separated by inter-metal dielectric layers 430A and 430B.

Although FIG. 4 illustrates two metal layers, it should be appreciated that embodiments may include more or less metal layers separated by inter-metal dielectric layers. Metal stack 430 is patterned in such a manner as to create an optical passage through the metal layers such that frontside microlens 440 can direct frontside incident light onto the topside of photosensitive region 405. Similarly, backside microlens 455 is positioned to direct backside incident light onto the backside of photosensitive region 405. Although FIG. 4 illustrates the use of two microlenses, one on each side, embodiments of dual-sided pixel cell 400 may be implemented without one or both microlenses 440 and 455.

Photosensitive region 405 may be implemented as a photodiode PD formed in epi layer 410. Pinning layer 420 is positioned at or near the frontside surface of epi layer 410, but in other embodiments, pinning layer 420 can be positioned elsewhere or even omitted entirely. In the illustrated embodiment, pinning layer 420 is a P type silicon layer, photosensitive region 405 is an N type silicon region, and epi layer 410 is a P type silicon layer, forming a p-n-p photodiode structure. In other embodiments the dopant polarities of the above layers can be reversed forming an n-p-n structure. In still other embodiments, epi layer 410 can be undoped or intrinsic silicon regardless of the dopant polarities of pinning layer 420 and photosensitive region 405. Backside doped layer 445 (e.g., P+ doped for P doped epi layer 410) is also an optional layer provided to passivate the backside surface and promote upward migration of photo-generated charge carriers into photosensitive region 405, which are formed deep in epi layer 410 due to the backside incident light.

Backside filter 450 and frontside filter 435 may be the same or different filter material. In some embodiments, one or both sides may not include an optical filter layer. However, since the optical path through the backside of dual-sided pixel cell 400 is not covered by metal stack 430 it therefore has less physical constraints and it is often a shorter optical path due to backside thinning of epi layer 410 and the lack of metal stack 430. Thus, the BSI side may be well suited for higher quality, full color image acquisition, while the FSI side may be well suited for alternative uses. For example, frontside filter 435 may be implemented as an infrared filter ("IR"), while backside filter 450 maybe be one element within a Bayer pattern color filter array. In one embodiment, the FSI side may simply include a clear filter layer over the entire frontside of pixel array 105 without frontside microlenses 440. In one embodiment, frontside filter 435 may be selected to extend the dynamic range of the pixel cell. Backside filter 450 may be a Bayer patterned color filter to receive chrominance information from the BSI side, while frontside filter 435 may be optional or even a clear filter to obtain luminance information from the FSI side. In other embodiments, both filters 435 and 450 maybe be Bayer patterned color filters. It should be appreciated that various combinations of filter types and microlenses (or lack thereof) may be used for the frontside and backside of dual-sided pixel cell 400.

Figure 5A:
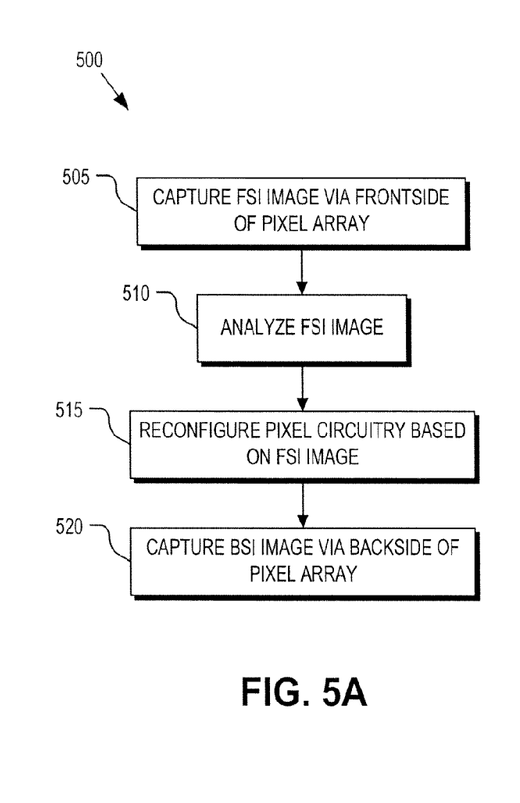
FIGS. 5A and 5B are flow charts illustrating processes of operating a dual-sided imaging system, in accordance with embodiments of the invention.
Figure 5B:
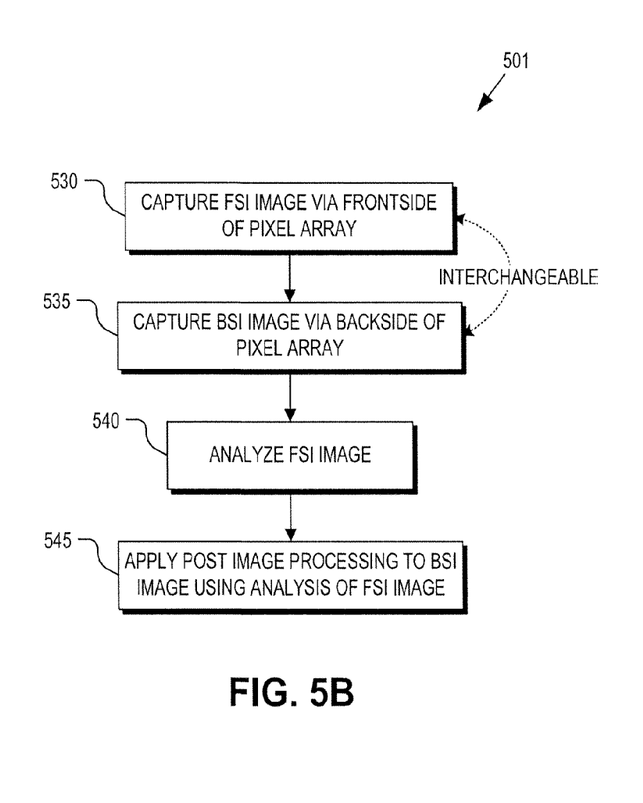

In one embodiment, dual-sided image sensor 100 may be operated without shutters 310 and 315 to simultaneously acquire high quality combination overlay images. However, as discussed above, dual-sided image sensor 100 may be operated with one or both of shutters 310 and 315 to acquire separate BSI image data and/or FSI image data. FIGS. 5A and 5B are flow charts illustrating processes 500 and 501 for operating dual-sided imaging system 300, in accordance with embodiments of the invention.

Process 500 (FIG. 5A) illustrates a method of operation which uses the FSI image data to reconfigure dual-sided image sensor 100 prior to acquiring the BSI image data. In a process block 505, the FSI image data is captured by pixel array 105 via the frontside incident light. In one embodiment, this may include optically opening frontside shutter 315 (e.g., causing frontside shutter 315 to become optically transmissive), while optically closing backside shutter 310. The frontside incident light results in photo-generated charge carriers, which are collected within photosensitive region 405 of each pixel cell. In a process block 510, the FSI image data is readout via readout circuitry 110 and analyzed. In one embodiment, the FSI image data is analyzed either for an average luminance value of the entire pixel array or for individual luminance values of each pixel or groups of pixels within the pixel array 105. In a process block 515, control circuitry 120 reconfigures the pixel circuitry of pixel array 105 and/or readout circuitry 110 based on this analysis and prior to capturing the BSI image data. For example, control circuitry 120 may adjust or reconfigure the length of the exposure window (e.g., shutter signal), adjust the gain of amplification circuitry, adjust whether a global shutter or rolling shutter is used, etc. Since the same pixel array 105 is used to capture both of the FSI and BSI image data, pixel registration between the two datasets is a simple matter of column/row addressing. Finally, in a process block 520, the BSI image data is captured using the same photosensitive regions within pixel array 105. In one embodiment, the BSI image data is captured by optically opening backside shutter 315 while optically closing frontside shutter 310.

In one embodiment, the photosensitive regions 405 of each pixel cell within pixel array 105 are reset (e.g., charged or discharged to a present value) between capturing the FSI image data and the BSI image data. In one embodiment, weighted combination overlay images can be obtained using post image processing by sequentially capturing images with an intermediate reset between the FSI and BSI image captures. Pixel registration between the sequentially captured images is achieved through column and row address which reduces the amount of processing circuitry required to obtain an weighted overlay image. In an alternative embodiment, photosensitive regions 405 are not reset between image acquisition windows, but rather the BSI image charge is added to the already stored FSI image charge. Sequential image captures without an intermediate reset of photosensitive region 405 enables generation of combination overlay images that use different length exposure times/windows between the BSI image data and the FSI image data. This technique permits weighted combination overlay images without additional post image process circuitry.

Process 501 illustrates a method of operation which uses the FSI image data to apply post image processing to the BSI image data after acquiring both image datasets. In a process block 530, the FSI image data is captured by pixel array 105 via the frontside incident light. In a process block 535, the BSI image data is captured by pixel array 105 via the backside incident light. The FSI image data and the BSI image data may be captured sequentially during offset exposure windows via appropriate manipulation of shutters 310 and 315 in interchangeable order. In a process block 540, the FSI image data is analyzed. In one embodiment, the FSI image data is analyzed for luminance values. In a process block 545, post image processing is executed by function logic 115 to adjust properties (e.g., brightness, contrast, etc.) of the BSI image data using the FSI image data. In one embodiment, individual pixel data portions of the BSI image data may be swapped for corresponding individual pixel data portions from the FSI image data. Such pixel swapping may be used to increase the dynamic range of the composite image or combination overlay image for improved color performance at low light levels compared to the same image captured using an image sensor with only a BSI or only an FSI optical path and only a single filter array.

Figure 6A:
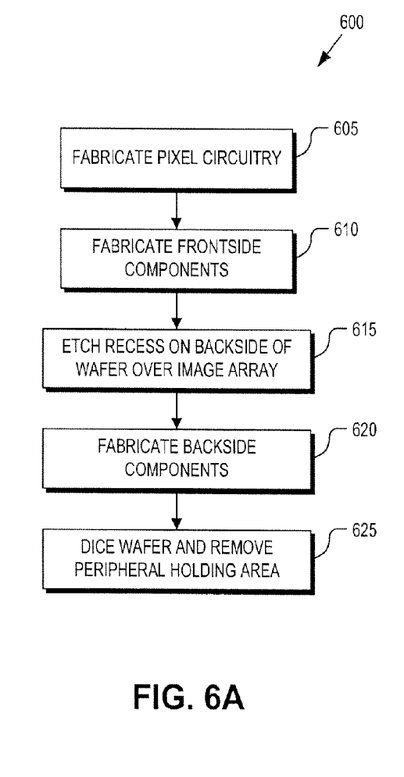
FIGS. 6A and 6B are flow charts illustrating processes of fabricating a dual-sided imaging system, in accordance with embodiments of the invention.
Figure 6B:
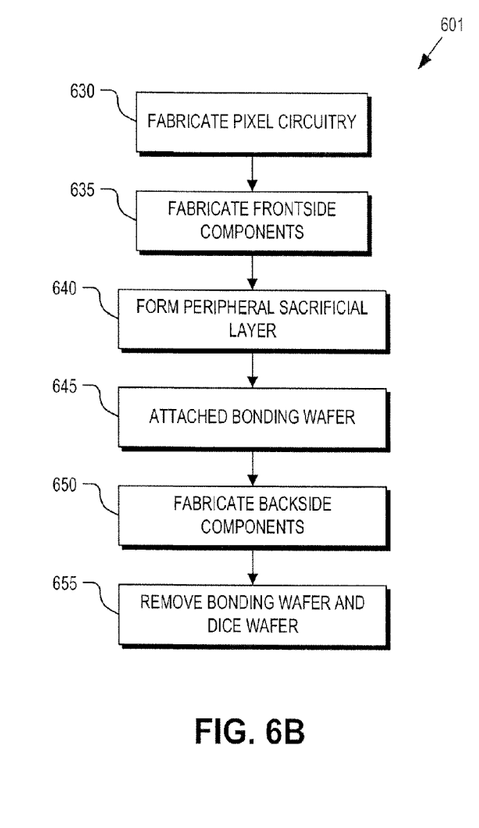
Figure 7A:
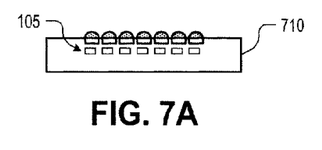
FIGS. 7A-7D are block diagrams illustrating a process of fabricating a dual-sided imaging system, in accordance with an embodiment of the invention.
Figure 7B:
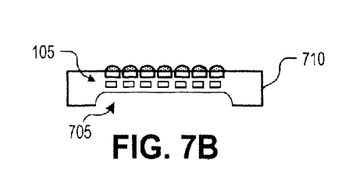
Figure 7C:
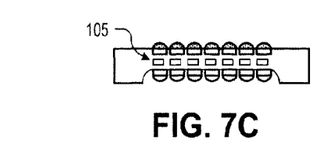
Figure 7D:
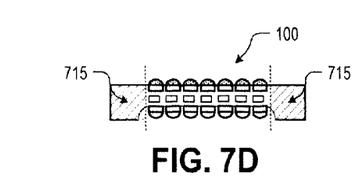
Figure 8A:
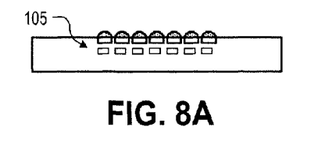
FIGS. 8A-8E are block diagrams illustrating a process of fabricating a dual-sided imaging system, in accordance with an embodiment of the invention.
Figure 8B:
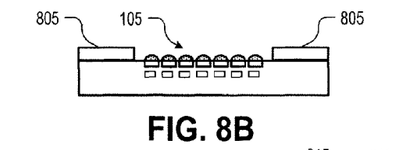
Figure 8C:
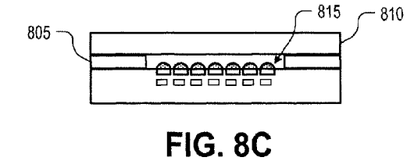
Figure 8D:
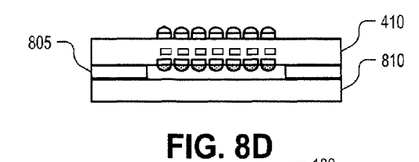
Figure 8E:
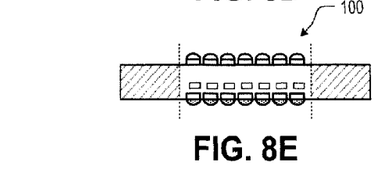

FIGS. 6A and 6B are flow charts illustrating processes 600 and 601, respectively, for fabricating dual-sided image sensor 100, in accordance with embodiments of the invention.

Process 600 is described in connection with the block diagrams of FIGS. 7A-7D. In a process block 605, the pixel circuitry (e.g., pixel circuitry 200) is fabricated into or onto the frontside of epi layer 410 following standard pixel circuitry fabrication techniques. In a process block 610, the frontside components (e.g., metal stack 430, frontside filter 435, and frontside microlens 440) are formed over the frontside of epi layer 410 (see FIG. 7A). In a process block 615, a recess 705 is etched out of the backside of wafer 710 under pixel array 105 (see FIG. 7B). The recess provides backside access for fabricating the backside components (process block 620; see FIG. 7C). The backside components may include backside doped layer 445, backside filter 450, and backside microlens 455. Finally, in a process block 625 wafer 710 is diced and the peripheral holding area 715 is removed (see FIG. 7D).

Process 601 is described in connection with the block diagrams of FIGS. 8A-8E. In a process block 630, the pixel circuitry (e.g., pixel circuitry 200) is fabricated into or onto the frontside of epi layer 410 following standard pixel circuitry fabrication techniques. In a process block 635, the frontside components (e.g., metal stack 430, frontside filter 435, and frontside microlens 440) are formed over the frontside of epi layer 410 (see FIG. 8A). In a process block 640, a peripheral sacrificial layer 805 is formed around pixel array 105 (see FIG. 8B). In a process block 645, a bonding wafer 810 is attached to the top of peripheral sacrificial layer 805 forming a cavity 815 that protects the top components of pixel array 105 (see FIG. 8C). The device wafer may then be flipped over and held by bonding wafer 810, while the backside substrate is thinned to expose epi layer 410, and the backside components are formed thereon (process block 650; see FIG. 8D). Finally, in a process block 655, bonding wafer 810 is removed and the device wafer diced to liberate the individual dual-sided image sensors 100 (see FIG. 8E).

Both fabrication techniques 600 and 601 follow conventional FSI fabrication processes to form metal stack 430 and create the frontside optical passage through the metal layers. The backside thinning may be performed with a combination of chemical mechanical polishing ("CMP") and chemical etching. The backside doped layer 445 may be implanted from the backside during backside processing prior to placement of backside filter 450 and backside microlens 455.

As described above, a CMOS image sensor having two-sided pixel cells where optical paths of incident light can reach the pixel array from both the frontside and the backside are described. This dual-sided configuration can eliminate the need for bulky camera modules required to house back-to-back bonded FSI image sensor chips and even above beam combiners and other optical devices used in conventional methods of capturing two images from separate optical sources and combining them to obtain one overlaid composite image. Another application of dual-sided image sensor 100 may be to capture two distinct images from separate optical sources (or 180 degree opposite directions) and can be precisely registered onto the surface of the image sensor. Yet another application may be to use the frontside and the backside to capture luminance and chrominance information, respectively, of the same image, which may increase the dynamic range of the combination overlay image.

It should be pointed out that the above description is based on an implementation using red, green and blue photosensitive elements. Those skilled in the art may appreciate that the description is equally applicable to other primary or complementary color filters. For example, magenta, yellow and cyan are a set of common alternative complementary colors that can be used to produce color images. In addition, having a set of green photosensitive elements interleaved or interspersed with alternating red and blue photosensitive elements is not a requirement to practice embodiments of the invention.

The order in which some or all of the process blocks appear in each process above should not be deemed limiting. Rather, one of ordinary skill in the art having the benefit of the present disclosure will understand that some of the process blocks may be executed in a variety of orders not illustrated.

The processes explained above may be described in terms of computer software and hardware. The techniques described may constitute machine-executable instructions embodied within a machine (e.g., computer) readable storage medium, that when executed by a machine will cause the machine to perform the operations described. Additionally, the processes may be embodied within hardware, such as an application specific integrated circuit ("ASIC") or the like.

A machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A dual-sided image sensor including a pixel array, wherein each pixel of the pixel array comprises:

a photosensitive region disposed within a single epitaxial layer;

a metal stack disposed over a frontside of the single epitaxial layer and including an optical path through the metal stack to the photosensitive region for passing frontside incident light to the photosensitive region;

a backside microlens disposed over a backside of the single epitaxial layer to direct backside incident light to the photosensitive region;

pixel circuitry coupled to the photosensitive region to capture frontside image data and backside image data from the photosensitive region; and readout circuitry coupled to the pixel array to readout the frontside image data and the backside image data as a combination overlay image that combines the frontside image data with the backside image data, wherein the photosensitive region disposed within the single epitaxial layer receives light through the backside and the frontside of the single epitaxial layer.

2. The dual-sided image sensor of claim 1, further comprising:

a backside filter array disposed between the backside microlens and the single epitaxial layer to apply a first type of filtering to the backside incident light; and a frontside filter array disposed over the metal stack to apply a second type of filtering to the frontside incident light, wherein the first type of filtering is different than the second type of filtering.

3. The dual-sided image sensor of claim 2, wherein the backside filter array comprises a color filter array to apply chromatic filtering to the backside incident light and the frontside filter array comprises a monochromatic filter array.

4. The dual-sided image sensor of claim 2, wherein the frontside filter array comprises a clear filter array or an infrared filter array.

5. The dual-sided image sensor of claim 2, wherein each pixel of the pixel array further comprises:

a frontside microlens disposed over the metal stack and aligned to direct the frontside incident light through the optical path to the photosensitive region.

6. The dual-sided image sensor of claim 1, further comprising:

readout circuitry coupled to the pixel array to selectively readout the frontside image data separately from the backside image data.

7. An imaging apparatus, comprising:
a dual-sided image sensor including:
an array of photosensitive regions disposed within a single epitaxial layer;
a metal stack disposed over a frontside of the semiconductor layer and including optical paths through the metal stack to the photosensitive regions for passing frontside incident light to the photosensitive regions;
a backside filter array disposed over a backside of the single epitaxial layer to filter backside incident light prior to reaching the photosensitive regions; and
readout circuitry coupled to readout frontside image data and backside image data from the photosensitive regions, wherein each of the photosensitive regions receives light through the backside and the frontside of the single epitaxial layer; and
a reflector positioned to reflect the frontside incident light onto a frontside of the dual-sided image sensor,
wherein the frontside incident light originates from a region facing a backside of the dual-sided image sensor.

8. The imaging apparatus of claim 7, further comprising:
a first shutter positioned to selectively block either the frontside incident light from reaching the frontside of the dual-sided image sensor or backside incident light from reaching the backside of the dual-sided image sensor.

9. The imaging apparatus of claim 8, further comprising:
a second shutter positioned to selectively block an opposite side of the dual-sided image sensor than is blocked by the first shutter.

10. The imaging apparatus of claim 7, wherein the dual-sided image sensor further comprises:
an array of microlenses disposed over the backside filter array to direct the backside incident light to the photosensitive regions.

11. The imaging apparatus of claim 10, wherein the dual-sided image sensor further comprises:
a frontside filter array disposed over the frontside of the single epitaxial layer to filter the frontside incident light prior to reaching the photosensitive regions.

12. The imaging apparatus of claim 7, wherein the readout circuitry is coupled to readout the frontside image data and the backside image data from the photosensitive regions as a combination overlay image that combines the frontside image data with the backside image data.

13. A method of operating a dual-sided complementary metal-oxide semiconductor ("CMOS") image sensor, the method comprising:
capturing frontside image data incident upon a frontside of the dual-sided CMOS image sensor within an array of photosensitive regions integrated into a single epitaxial layer of the dual-sided CMOS image sensor;
capturing backside image data incident upon a backside of the dual-sided CMOS image sensor within the array of photosensitive regions integrated into the single epitaxial layer, wherein each of the photosensitive regions receives light through the backside and the frontside of the single epitaxial layer;
reading out the backside image data from the array of photosensitive regions;
reading out the frontside image data from the array of the photosensitive regions; and
applying posting imaging processing to the backside image data based upon the frontside image data.

14. The method of claim 13, wherein the frontside image data and the backside image data are captured during a single exposure window, wherein the frontside image data and the backside image data are combined within a single combination overlay image, and wherein reading out the backside image data and reading out the frontside image data occurs simultaneously.

15. The method of claim 13, wherein the frontside image data is captured during a first exposure window and the backside image data is captured during a second exposure window offset in time from the first exposure window, wherein the frontside image data is readout separate from the reading out the backside image data.

16. A method of operating a dual-sided complementary metal-oxide semiconductor ("CMOS") image sensor, the method comprising:
capturing frontside image data incident upon a frontside of the dual-sided CMOS image sensor within an array of photosensitive regions integrated into a single epitaxial layer of the dual-sided CMOS image sensor;
analyzing of the frontside image data;
configuring the dual-sided CMOS image sensor based on the analyzing prior to capturing backside image data; and
capturing the backside image data incident upon a backside of the dual-sided CMOS image sensor within the array of photosensitive regions integrated into the single epitaxial layer, wherein each photosensitive regions receives light through the backside and the frontside of the single epitaxial layer, wherein the dual-sided CMOS image sensor is configured based on the analysis of the frontside image data when capturing the backside image data; and reading out the backside image data from the array of photosensitive regions.

17. The method of claim 16, wherein configuring the dual-sided CMOS image sensor includes at least one of adjusting a gain setting, adjusting an exposure window, or adjusting a flash setting.

18. A dual-sided image sensor including a pixel array, wherein each pixel of the pixel array comprises:
   a photosensitive regions disposed within a single epitaxial layer;
   a metal stack disposed over a frontside of the single epitaxial layer and including an optical path through the metal stack to the photosensitive regios for passing frontside incident light to the photosensitive region;
   a backside microlens disposed over a backside of the single epitaxial layer to direct backside incident light to the photosensitive region;
   pixel circuitry coupled to the photosensitive region to capture frontside image data and backside image data from the photosensitive region;
   a backside filter array disposed between the backside microlens and the single epitaxial layer to apply a first type of filtering to the backside incident light; and
   a frontside filter array disposed over the metal stack to apply a second type of filtering to the frontside incident light, wherein the first type of filtering is different than the second type of filtering, wherein the backside filter array comprises a color filter array to apply chromatic filtering to the backside incident light and the frontside filter array comprises a monochromatic filter array, wherein the photosensitive region disposed within the single epitaxial layer receives light through the backside and the frontside of the single epitaxial layer.

* * * * *